US012228594B2

(12) United States Patent
Ashokkumar et al.

(10) Patent No.: US 12,228,594 B2
(45) Date of Patent: Feb. 18, 2025

(54) GLITCH FREE BROWN OUT DETECTOR

(71) Applicant: Infineon Technologies LLC, San Jose, CA (US)

(72) Inventors: Jayant Ashokkumar, Colorado Springs, CO (US); Gregory W. Pauls, San Jose, CA (US)

(73) Assignee: Infineon Technologies LLC, San Jose, CA (US)

( * ) Notice: Subject to any disclaimer, the term of this patent is extended or adjusted under 35 U.S.C. 154(b) by 379 days.

(21) Appl. No.: 17/654,482

(22) Filed: Mar. 11, 2022

(65) Prior Publication Data
US 2023/0176095 A1 Jun. 8, 2023

Related U.S. Application Data

(60) Provisional application No. 63/286,851, filed on Dec. 7, 2021.

(51) Int. Cl.
*G01R 1/00* (2006.01)
*G01R 19/165* (2006.01)
*H03K 19/00* (2006.01)

(52) U.S. Cl.
CPC ... *G01R 19/16566* (2013.01); *H03K 19/0021* (2013.01)

(58) Field of Classification Search
CPC ........ G01R 19/16552; G01R 19/16566; G01R 19/16538; G01R 19/16542
See application file for complete search history.

(56) References Cited

U.S. PATENT DOCUMENTS

| | | | |
|---|---|---|---|
| 5,637,971 A * | 6/1997 | Pratt | G05B 11/28 318/599 |
| 10,454,468 B1 * | 10/2019 | Estrada | G01R 19/16552 |
| 2006/0001131 A1 | 1/2006 | Roohparvar | |
| 2006/0229830 A1 | 10/2006 | Saether | |
| 2007/0253240 A1 | 11/2007 | Manohar et al. | |
| 2008/0272427 A1 | 11/2008 | Van Schaijk et al. | |
| 2009/0268488 A1 | 10/2009 | Fujii | |
| 2010/0289531 A1 | 11/2010 | Sudjian | |
| 2019/0120881 A1 * | 4/2019 | Yoo | H03K 17/302 |
| 2019/0137548 A1 * | 5/2019 | Hsu | H03K 17/223 |

OTHER PUBLICATIONS

Infineon Technologies LLC, "Written Opinion of the International Searching Authority and Search Report", PCT/US2022/077545, Mar. 14, 2023, 11 pages.

* cited by examiner

*Primary Examiner* — Thang X Le
(74) *Attorney, Agent, or Firm* — Slater Matsil, LLP

(57) ABSTRACT

In accordance with an embodiment, a circuit includes a plurality of comparators disposed on an integrated circuit, the plurality of comparators having inputs coupled to a monitored power supply line; and a voting circuit having inputs coupled to outputs of the plurality of comparators. An output of the voting circuit is configured to provide a signal indicative of a brown out condition of a power source coupled to the monitored power supply line.

22 Claims, 10 Drawing Sheets

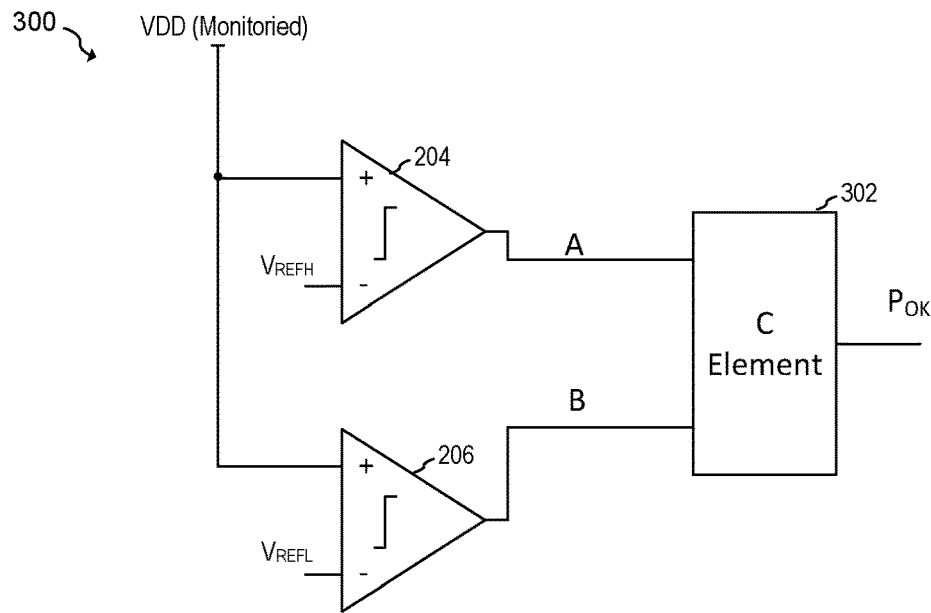
*FIG. 3A*
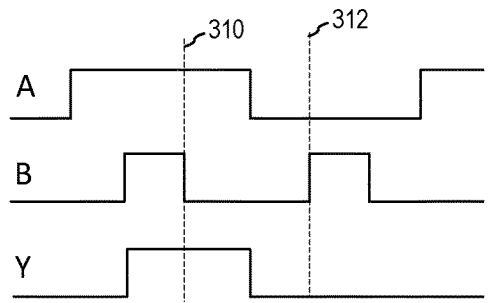
*FIG. 3B*  *FIG. 3C*
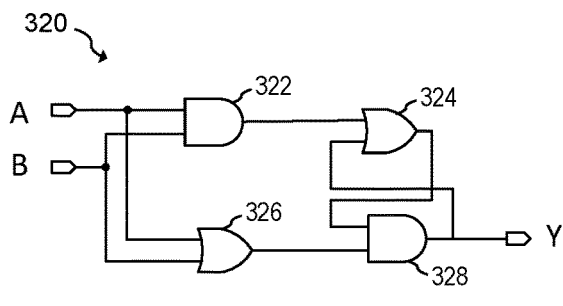 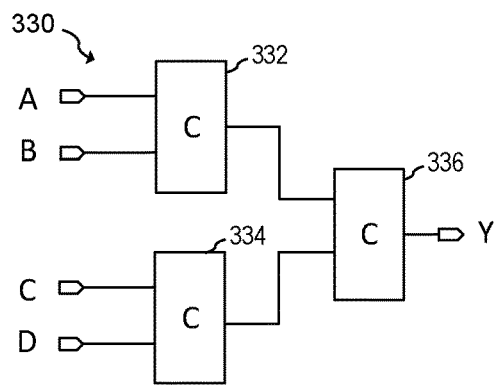
*FIG. 3D*  *FIG. 3E*

GLITCH FREE BROWN OUT DETECTOR

CROSS-REFERENCE TO RELATED APPLICATIONS

This application claims the benefit under 35 U.S.C. § 119(e) of U.S. Provisional Patent Application No. 63/286,851, filed on Dec. 7, 2021, which is incorporated herein by reference in its entirety for all purposes.

GOVERNMENT INTERESTS

The invention described herein was made with government support under subcontract 07070-SC-001 awarded by Microelectronic Research Development Co. (Micro-RDC) as part of the prime contract FA9453-19-C-0011 awarded by the Air Force Research Laboratory. The United States Government has certain rights in the invention.

TECHNICAL FIELD

The present invention relates generally to a brown out detector devices with or without C element compensation and methods of operation thereof.

BACKGROUND

Many circuits and systems are designed to receive a power supply voltage having a specified range. For example, a simple battery powered device that uses two 1.5 V batteries may be designed to operate with a power supply voltage of between 2.5 V and 3.5 V. However, when the power supply voltage drops below the minimum specified voltage 2.5V, circuits within the device may no longer operate in a predictable manner, and the behavior of the circuit may become erratic. In order to avoid possible negative effects at low power supply voltages, many circuits and systems include a brown out detector, which is a circuit that monitors the power supply, and provides a signal indicative of a low power supply voltage condition. Thus, the circuit or system may be automatically shut off upon receipt of the signal indicating the low power supply voltage condition.

Systems, such as digital processors, may have noisy power supply voltages due to the interaction between circuit switching behavior and inductive power supply lines. Accordingly, one challenge in the design of brown out detectors is addressing the problem of false triggering due to transient voltages on the power supply line. For example, when a circuit that otherwise has a sufficient power supply voltage undergoes a short transient or voltage glitch on the power supply, it is often desirable to keep the circuit operational. However, if short transients or voltage glitches were regularly misinterpreted as brown out conditions, the system may be shut down unnecessarily.

Such false triggering may be avoided by low pass filtering the power supply being monitored for the low power condition. However, low pass filtering may cause a delay in detecting the lower voltage condition, which may cause the system to operate in an erratic manner for a short period of time.

SUMMARY

In accordance with an embodiment, a circuit includes a plurality of comparators disposed on an integrated circuit, the plurality of comparators having inputs coupled to a monitored power supply line; and a voting circuit having inputs coupled to outputs of the plurality of comparators. An output of the voting circuit is configured to provide a signal indicative of a brown out condition of a power source coupled to the monitored power supply line.

In accordance with another embodiment, a method of operating an integrated circuit includes: comparing a first voltage at a first point of a power supply bus to a first reference voltage; comparing a second voltage at a second point of a power supply to a second reference voltage; transitioning to a brown out state when the first voltage is less than the first reference voltage and the second voltage is less than the second reference voltage; after transitioning to the brown out state, remaining in the brown out state when the first voltage remains less than the first reference voltage or the second voltage is remains less than the second reference voltage; transitioning out of the brown out state when the first voltage exceeds the first reference voltage and the second voltage exceeds the second reference voltage; after transitioning out of the brown out state, remaining out of the brown out state when the first voltage remains higher than the first reference voltage or the second voltage remains higher than the second reference voltage; and indicating a brown out condition upon transitioning to the brown out state.

In accordance with a further embodiment, an integrated circuit includes: a memory circuit; a conductive power supply bus coupled between a power source node and a power supply input of the memory circuit; a brown out detector coupled to the conductive power supply bus, the brown out detector including: a first comparator having a signal input coupled to the conductive power supply bus; a second comparator having a signal input coupled to the conductive power supply bus; and a voting circuit having inputs coupled to outputs of the first comparator and the second comparator, and an output coupled to a shutdown input of the memory circuit.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates a schematic of a brown out detector according to an embodiment; FIG. 3B illustrates a truth table of an embodiment voting circuit; FIG. 3C illustrates a timing diagram of an embodiment voting circuit; FIG. 3D illustrates a schematic of an embodiment voting circuit; and FIG. 3E illustrates a block diagram of an embodiment voting circuit;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a brown out detector for monitoring a power supply is implemented using a plurality of comparators and a voting circuit. In some embodiments, the voting circuit indicates a brown out condition when a majority of the comparators indicate a low power supply voltage. In other embodiments, such as embodiments that include two comparators, the voting circuit is implemented using a c-element that indicates a brown out condition when both comparators indicate a low power supply voltage, or when a brown out condition already exists and at least one of the comparators indicates a low power supply voltage.

An advantage of embodiments includes the ability to reduce the occurrence of false brown out detection, which may occur when a large transient current momentarily decreases the voltage at a power supply node. In some embodiments, the false detection may be reduced without low pass filtering the power supply node and/or without using comparators with hysteresis circuitry. This advantageously allows for very fast brown out detection using a small, compact circuit, as well as the ability to quickly detect brown out conditions while avoiding the false detection of brown out conditions. Some embodiments also advantageously avoid delay induced power supply toggling. This phenomenon occurs when the brown out detector incorrectly detects a brown out condition in response to a transient and shuts down the powered circuitry. Once the powered circuitry is shut down, the power supply voltage quickly recovers, which is again detected by the brown out detector, thereby causing the powered circuitry to shut down for a short period of time that depends on the delay of the brown out detector. Thus, whenever the brown out detector is falsely triggered, the powered circuitry is shut down. In some cases, starting the circuitry back up again may take a few milliseconds.

Figure 1:
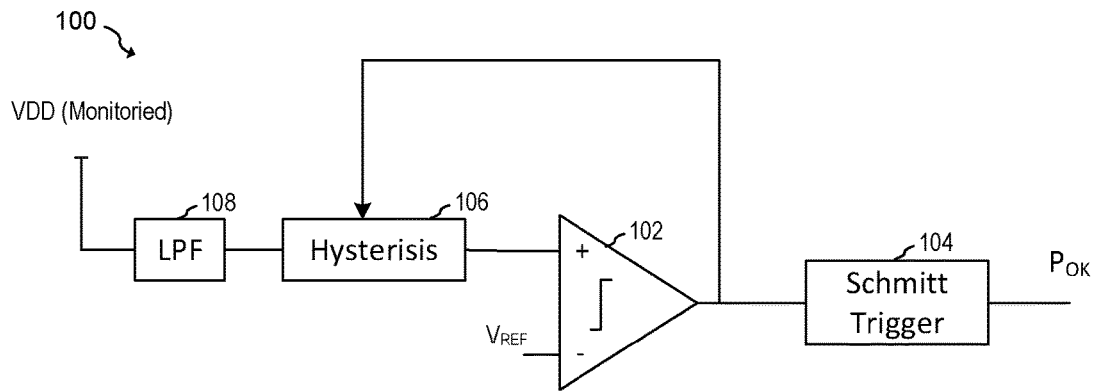
FIG. 1 illustrates a schematic of an exemplary brown out detector.

FIG. 1 illustrates an exemplary brown out detector 100. As shown, brown out detector 100 includes comparator 102, Schmitt trigger 104, hysteresis block 106, and low-pass filter 108. During operation, comparator 102 compares the voltage at the monitored power supply VDD with a reference voltage $V_{REF}$. In principle, when the voltage of monitored power supply VDD is greater than voltage $V_{REF}$, power supply status signal $P_{OK}$ is high, which indicates that the monitored power supply voltage VDD has a sufficiently high voltage to reliably power connected circuitry. On the other hand, when the voltage of monitored power supply VDD is not greater than voltage $V_{REF}$, power supply status signal $P_{OK}$ is low, which indicates that the monitored power supply voltage VDD is too low to reliably supply power to connected circuitry. Power supply status signal $P_{OK}$ may be used to shut down the connected circuitry under such low power conditions.

In most practical systems, the power supply voltage is often noisy due to on-chip switching behavior. As such, low pass filtering and hysteresis are often added to brown out detection circuits to avoid metastable behavior at the output of the comparator when the voltage of monitored power $V_{DD}$ is very close to reference voltage $V_{REF}$. In order to avoid such metastable behavior, hysteresis and low-pass filtering are often added to brown out detection circuits. For example, exemplary brown out detector 100 includes low pass filter 108 that is configured to filter the supply voltage, thereby attenuating high frequency transients. Hysteresis block 106 shifts the input voltage to comparator 102 based on the output of comparator 102 which causes the threshold of comparator 102 to depend on the output of comparator 102, thereby reducing the incidence of "chatter" at the output of comparator 102. Lastly, Schmitt trigger 104 applies further hysteresis to the output of comparator 102, which can have a lower slope and/or a slower response when the voltage of monitored power $V_{DD}$ is very close to reference voltage $V_{REF}$.

While each of the low-pass filter 108, hysteresis block 106, and Schmitt trigger 104, may be effective in reducing the metastable behavior of comparator 102, this reduction in metastable behavior may come at a cost of extra circuitry and slower response.

Figure 2:
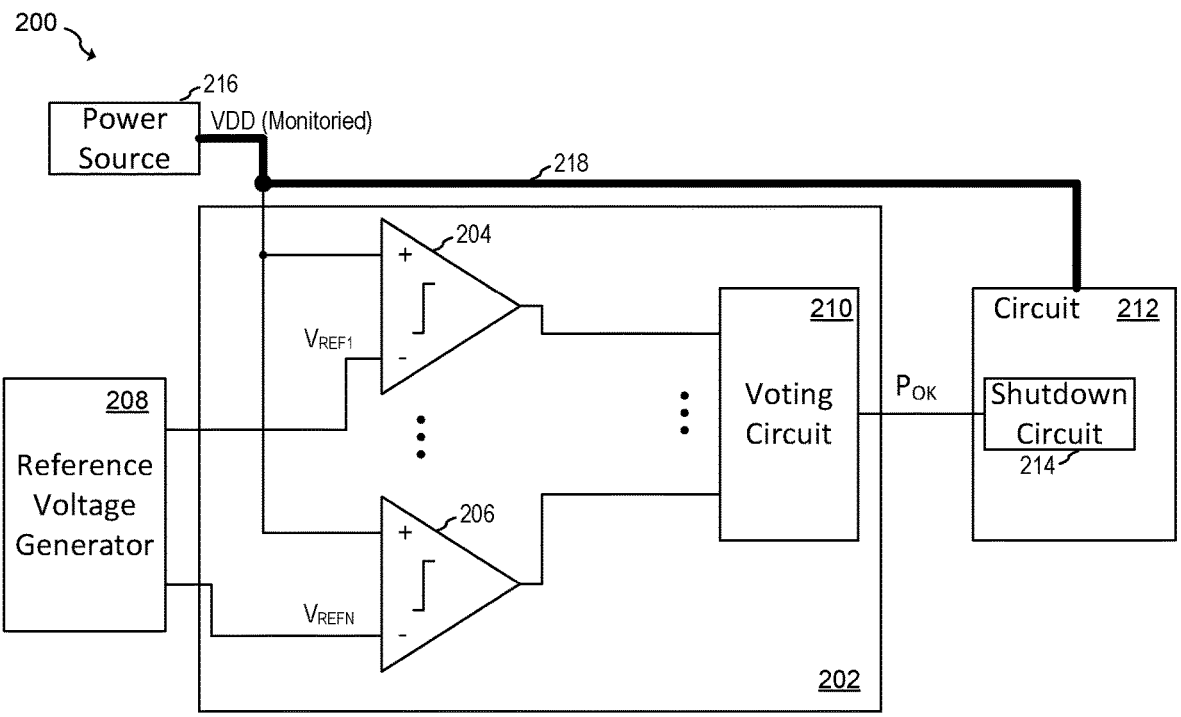
FIG. 2 illustrates a schematic of a brown out detector according to an embodiment.

FIG. 2 illustrates a brown out detector system 200 according to an embodiment of the present invention. Brown out detector system 200 includes brown out detector 202, reference voltage generator 208 and a powered circuit 212 that receives its power from the power supply monitored by brown out detector 202.

In embodiments of the present invention, brown out detector 202 includes a plurality of comparators 204 to 206 and a voting circuit 210 to monitor the power supply voltage VDD of conductive power supply bus 218. While only two comparators 204 and 206 are explicitly shown, brown out detector 202 may include more than two comparators in some embodiments. The voting circuit 210 is configured to indicate a brown out condition when a majority of the comparators 204 to 206 indicate that a brown out condition exists. In some embodiments, voting circuit 210 indicates that a brown out condition exists when a majority of comparators 204 to 206 indicate that the power supply voltage is too low. In other words, each comparator 204 to 206 is given a "vote" regarding the status of the power supply. Such a majority function could be implemented using a majority gate described below with respect to FIG. 4B.

In some embodiments, such as embodiments that use an even number of comparators, an additional "vote" is given to a previous output state of brown out detector 202. For example, in a system that has two comparators 202 and 206, the voting circuit indicates that a brown out condition exists when both comparators 204 and 206 indicate a brown out condition or when the voting circuit 210 previously indicates a brown out condition (e.g. $P_{OK}$ is not asserted) and at least one of comparators 204 and 206 indicates a brown out condition (e.g. the voltage at the positive terminal is less than the voltage at the negative terminal.) In such embodiments, voting circuit 210 could be implemented using a circuit such as a Muller c-element as described below with respect to FIGS. 3A-3E.

As shown, power source 216 is configured to provide power to circuit 212 via a conductive power supply bus 218. Brown out detector 202 is coupled to conductive power supply bus 218 and is configured to monitor the voltage on conductive power supply bus 218. During operation, when the voltage of conductive power supply bus 218 is above a predetermined voltage, power supply status signal $P_{OK}$ is asserted.

In various embodiments, power supply status signal $P_{OK}$ is coupled to an input of shutdown circuit 214 within circuit 212, such that when power supply status signal $P_{OK}$ is not asserted, circuit 212 is placed in a power down state. In some embodiments, for example, where circuit 212 is a clocked digital circuit, shutdown circuit 214 may place circuit 212 in a power down state by gating a clock. In other embodiments, shutdown circuit 214 may power down circuit 212 by disconnecting circuit 212 from conductive power supply bus 218. Such a disconnection may be achieved, for example, by opening a switch coupled between conductive power supply bus 218 and an internal power supply bus within circuit 212. In alternative embodiments, power supply status signal $P_{OK}$ may be routed to another circuit separate from circuit 212, such as a controller that is responsible for managing the power supply status of various circuits and/or may be routed to an external pin, status register or digital interface.

Power source 216 is representative of any power source that could be coupled to conductive power supply bus 218. In some embodiments, power source 216 may be an external DC power supply, such as a regulated DC power supply or a battery. In such embodiments, conductive power supply bus 218 is electrically connected to a bond pad or other external connection to the integrated circuit on which conductive power supply bus 218 and circuit 212 is disposed.

Brown out detector 202 includes a plurality of comparators 204 and 206 and a voting circuit 210. Comparators 204 and 206 are each configured to compare a respective reference voltage with a voltage VDD of conductive power supply bus 218. For example, comparator 204 compares voltage VDD with a voltage at node $V_{REF1}$ and comparator 206 compares voltage VDD with a voltage at node $V_{REFN}$. While only two comparators 204 and 206 are illustrated for ease of illustration, it should be understood that brown out detector 202 could include greater than two comparators in some embodiments. Each comparator 204 and 206 may be implemented using comparator circuits known in the art. For example, in some embodiments, comparators 204 and 206 may be implemented using a differential amplifier, such as an emitter coupled pair of BJT transistors, or a source coupled pair of MOS transistors with current supplied to the transistors via a current source or resistor. In some embodiments, the comparators 204 and 206 may include one or more level shifters at the positive and/or negative input terminals in order to shift the measured supply voltage to a lower voltage level.

In alternative embodiments of the present invention, comparators 204 and 206 may be replaced by individual brown out detection circuits, such as brown out detector 100 shown in FIG. 1. In this alternative embodiment, the respective brown out detector may include a comparator and at least one of low pass filter 108, hysteresis block 106 or Schmitt trigger 104. Other brown out detectors known in the art could also be used.

In some embodiments, the voltages at nodes $V_{REF1}$ and $V_{REF2}$ may be generated by reference voltage generator 208.

The voltages at nodes $V_{REF1}$ and $V_{REF2}$ may be either the same or different depending on the particular embodiment and its specifications. Reference voltage generator 208 may be implemented using voltage reference circuits known in the art, such as a bandgap voltage reference. In some embodiments, one or more comparators 204 and 206 are coupled to the same physical reference voltage, but are provided different effective comparison thresholds via internal voltage dividers coupled to the positive input that have different voltage division ratios. Accordingly, in some embodiments, comparators 204 and 206 may effectively compare the voltage of conductive power supply bus 218 to different reference voltages by dividing the voltage of conductive power supply bus 218 by using different voltage division ratios (e.g. using a resistive voltage divider) and comparing the divided voltages to a same reference voltage. In some embodiments, an adjustable voltage divider is used to perform the voltage division, as well as being used to apply hysteresis to its respective comparator as discussed below with respect to FIG. 8.

FIG. 3A illustrates a brown out detector 300 according to an embodiment of the present invention that can be used to implement brown out detector 202 shown in FIG. 2. As shown, brown out detector 300 includes two comparators 204 and 206 and c-element 302 having inputs coupled to the outputs of comparators 204 and 206.

In an embodiment, comparator 204 is configured to compare monitored supply voltage VDD with reference voltage $V_{REFH}$ and comparator 206 is configured to compare monitored supply voltage VDD with reference voltage $V_{REFL}$, where $V_{REFH}$ is a higher voltage than $V_{REFL}$. Using two different reference voltages effectively gives brown out detector 300 the ability to provide a both a fast response and hysteresis in detecting monitored supply voltage VDD. In various embodiments, reference voltages $V_{REFL}$, where $V_{REFH}$ may be set to be less than the lowest expected operating voltage for a particular circuit or system. For example, in a system that has a nominal operating voltage of 3.3 V and a minimum operating voltage of 3.0 V, reference voltage $V_{REFH}$ might be set to 2.85 V and reference voltage $V_{REFL}$ might be set to 2.80 V. Thus, when the power supply ramps up to its nominal value at startup, power supply status signal $P_{OK}$ would not be asserted until the power supply voltage is at least 2.85 V. On the other hand, in the case of a brown out condition, power supply status signal $P_{OK}$ would not be de-asserted until the power supply voltage reaches at least 2.80 V. It should be understood that this is just one specific numerical example of many possible embodiment examples. The actual reference voltages $V_{REFH}$ and $V_{REFL}$ used could be different in alternative embodiments. In some embodiments, the values used for reference voltages $V_{REFH}$ and $V_{REFL}$ may depend on the details of the circuitry being supplied by power supply voltage VDD and its ability to reliably withstand lower voltages.

It should be appreciated that in some embodiments, reference voltages $V_{REFH}$ and $V_{REFL}$ may be closer together than in embodiments that rely on applying hysteresis to a single comparator, such as the exemplary brown out detector 100 shown in FIG. 1. This is because it is often necessary to increase the amount of hysteresis in brown out detector 100 (which causes a corresponding decrease in the available headroom for the circuit) in order to prevent or mitigate detection delay induced toggling discussed above. Thus, the decreased amount of hysteresis in some embodiments provides a corresponding increase in headroom.

In an embodiment, c-element 302 (also known in the art as a "Muller C-element") is described with respect to FIGS.

3B, 3C and 3E. FIG. 3B illustrates a truth table of c-element 302 that implements the following logical equation:

$$Y_n = A \cdot B + (A+B) \cdot Y_{n-1},$$

where $Y_n$ is the next output of c-element 302 (e.g. the next value of power supply status signal $P_{OK}$), $Y_{n-1}$ is the previous output of c-element 302, and A and B are the logical inputs of c-element 302 (e.g. the logical outputs of comparators 204 and 206). As shown in FIG. 3B, $Y_n$ is "1" when both A and B is high, which means that power supply status signal $P_{OK}$ is asserted when both comparators 204 and 206 determine that the monitored supply voltage VDD is greater than their respective reference voltage inputs; and $Y_n$ is "0" when both A and B are low, which means that power supply status signal $P_{OK}$ is not asserted when both comparators 204 and 206 determine that the monitored supply voltage VDD is not greater than their respective reference voltage inputs. However, when the outputs of comparators 204 and 206 are in different states (e.g. A="1" and B="0" or A="0" and B="1"), for example, when one of comparators 204 and 206 determines that the monitored supply voltage VDD is greater than its respective reference voltage and the other one of comparators 204 and 206 determines that monitored supply voltage VDD is not less than its respective reference voltage, the value of power supply status signal $P_{OK}$ remains unchanged. Thus, if power supply status signal $P_{OK}$ was previously asserted, the signal remains asserted; and if power supply status signal $P_{OK}$ was previously unasserted, the signal remains unasserted.

FIG. 3C illustrates a timing diagram of c-element 302 that is consistent with the truth table of FIG. 3B. In particular, it can be seen that at times 310 and 312, when signals A and B transition from being in the same state to being in a different state, output Y remains in the same state. It is this property of c-element 302 that allows the output of one comparator to toggle without causing the output of brown out detector $P_{OK}$ from toggling.

FIG. 3D illustrates a schematic of a c-element 320 that could be used to implement c-element 302 in FIG. 3A. As shown, c-element 320 includes AND gates 322 and 328, and OR gates 324 and 326. The inputs of AND gate 322 and OR gate 326 are coupled to inputs A and B. The inputs of OR gate 324 is coupled to the outputs of AND gates 322 and 328, and the input of AND gate 328 is coupled to the outputs of OR gates 324 and 326, thereby forming a latch. It should be understood that c-element 320 shown in FIG. 3D is just one of many possible ways to implement c-element 302. In alternative embodiments, other c-element circuits known in the art could be used.

In some embodiments, c-elements can be used to implement voting circuits with more than two inputs. For example, FIG. 3E illustrates a schematic of voting circuit 330 having four inputs that includes three c-element circuits 332, 334 and 336. As shown, c-element 332 is coupled to inputs A and B, c-element 334 is coupled to inputs C and D, and c-element 336 is coupled to the outputs of c-elements 332 and 334 to produce output Y. In such an embodiment, inputs A, B, C and D correspond to outputs of four different comparators. Cascading c-elements in this manner is especially suitable for systems having an even number of comparators; however, embodiments could be adapted for systems having an odd number of comparators. For example, for a system with three inputs A, B and C, c-element 334 could be omitted and the output C of a third comparator could be coupled directly to c-element 336.

Figure 4A:
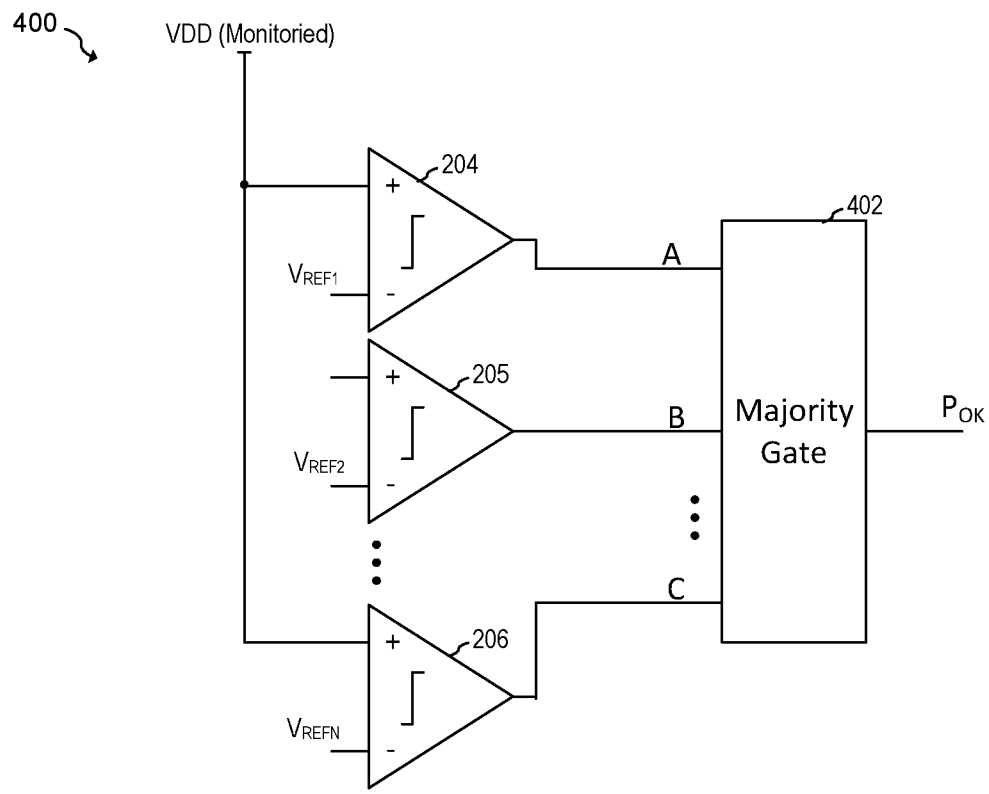
FIG. 4A illustrates a schematic of a brown out detector according to an embodiment.

FIG. 4A illustrates a brown out detector 400 according to an embodiment of the present invention that can be used to implement brown out detector 202 shown in FIG. 2. As shown, brown out detector 400 includes at least three comparators 204, 205 and 206 and majority gate 402 having at least three inputs coupled to the outputs of comparators 204, 205 and 206. In various embodiments, majority gate 402 is configured to assert power supply status signal $P_{OK}$ when a majority of its inputs are asserted.

In an embodiment, comparators 204, 205 and 206 are configured to compare monitored supply voltage VDD with respective reference voltages $V_{REF1}$, $V_{REF1}$, and $V_{REFN}$. In some embodiments these reference voltages are configured to be different, while in other embodiments two more of reference voltages $V_{REF1}$, $V_{REF1}$, and $V_{REFN}$ may be configured to be the same.

Figure 4B:
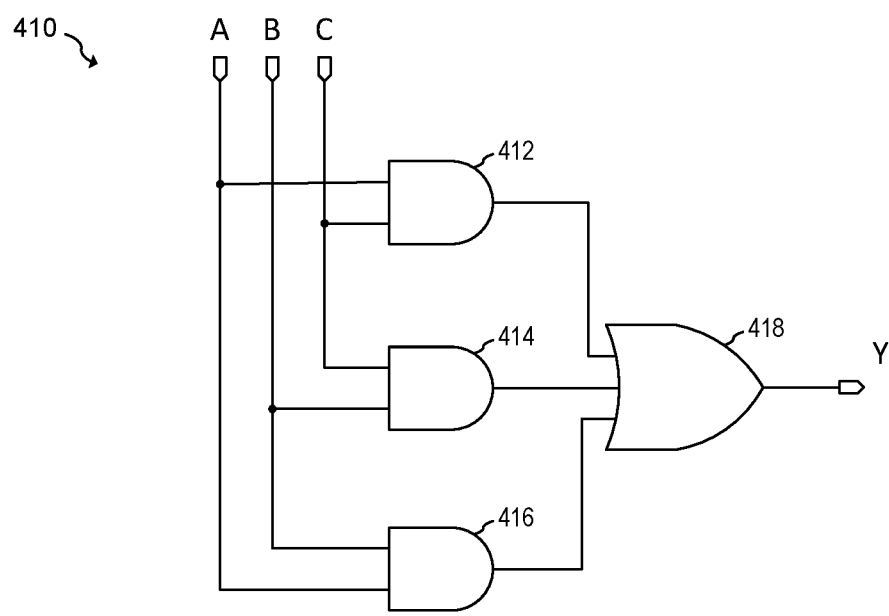
FIG. 4B illustrates a schematic of an embodiment voting circuit.

FIG. 4B illustrates a schematic of a majority gate 410 that could be used to implement majority gate 402 shown in FIG. 4A. Majority gate 410 includes AND gates 412, 414 and 416 and OR gate 418. The inputs to AND gate 412 are coupled to inputs A and C, the inputs to AND gate 414 are coupled to inputs B and C, and the inputs to AND gate 416 are coupled to inputs A and B. Thus, when at least two of three inputs A, B and C are asserted, output signal Y is asserted. It should be understood that the implementation of majority gate 410 shown in FIG. 4B is just one example of many possible ways to implement a majority gate. In alternative embodiments, other majority gate structures or other logically equivalent circuits could be used. For example, in some embodiments, AND gates 412, 414 and 416 and OR gate 418 could each be replaced by a NAND gate. In further alternative embodiments, majority gate 410 could be adapted to perform a majority function for greater than three inputs.

In embodiments described above, it should be understood that the digital logic circuits described herein represent just a few specific examples of embodiment logic circuits. In alternative embodiments, other logically equivalent circuits could be used. Moreover, it should be understood that disclosed logic circuits using active high signals could also be adapted to accept as input and/or produce as output active low signals using digital logic design techniques known in the art.

FIGS. 5A-5F illustrate block diagrams of integrated circuits that implement brown out detectors according to various embodiments. Embodiments of the present invention may be implemented in a variety of semiconductor processes, including, but not limited to a standard CMOS process and/or a CMOS process that has been modified to accommodate one or more particular types of non-volatile memory, a bipolar process, or a BiCMOS process. The various components depicted in FIG. 5A-5F may be disposed, for example on a single semiconductor substrate, such as a silicon substrate.

Figure 5A:
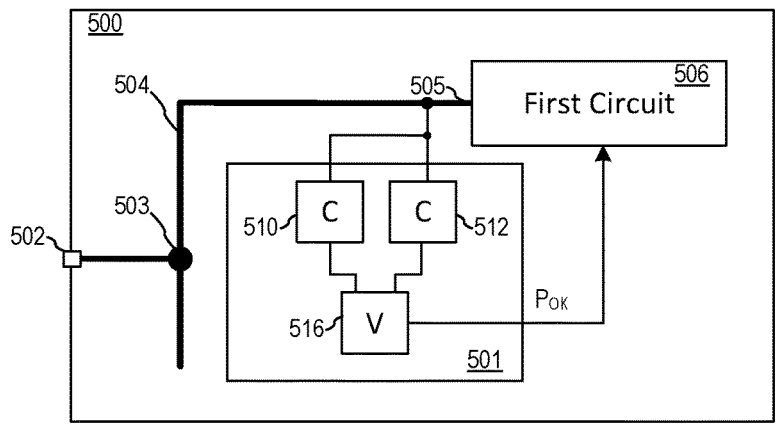
FIGS. 5A, 5B, 5C, 5D, 5E and 5F illustrate block diagrams of integrated circuits that use embodiment brown out detectors.

FIG. 5A illustrates an integrated circuit that includes a first circuit 506 having a power supply input node 505 coupled to power supply pin 502 via a conductive power supply bus 504. In various embodiments, conductive power supply bus 504 may be implemented on one or more conductive layers of integrated circuit 500, such as a metal layer or a polysilicon layer. A brown out detection circuit 501 includes a first comparator 510 and a second comparator 512 having signal inputs that are physically/electrically connected to a point on conductive power supply bus 504 that is close to power supply input node 505 of first circuit 506. The outputs of first comparator 510 and second comparator 512 are coupled to voting circuit 516, which may be implemented using one or more c-elements or a majority gate as described above with respect to the embodiments of FIGS. 2, 3A-3E and 4A-4B. In various embodiments, the brown out detection circuit 501 is connected to the conductive power supply bus 504 at a point that is closer to power supply pin 502 and/or is closer to power star node 503 (also referred to as a "star point"), which is a point at which conductive power supply bus 504 branches out into a plurality of power supply bus segments. In an embodiment, comparators 510 and 512 may have different comparison thresholds as described above with respect to FIGS. 2, 3A and 4A.

As shown, power supply status signal $P_{OK}$ is coupled to first circuit 506. In some embodiments, first circuit 506 is configured to shut down when power supply status signal $P_{OK}$ is not asserted, as described above with respect to FIG. 2.

Figure 5B:
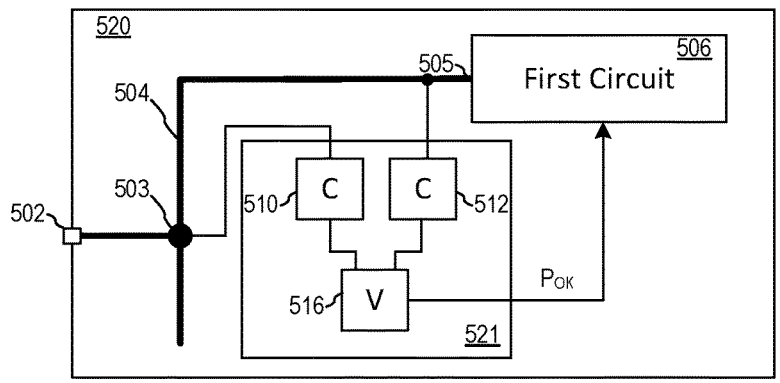

FIG. 5B illustrates an integrated circuit 520 that includes a first circuit 506 having a power supply input node 505 coupled to power supply pin 502 via conductive power supply bus 504. Brown out detector 521 includes a first comparator 510 having a signal input connected to star node 503 of conductive power supply bus 504, and a second comparator 512 with a signal input connected to conductive power supply bus 504 in the vicinity of power supply input node 505 of first circuit 506. In some embodiments, the signal input to first comparator 510 is connected to conductive power supply bus 504 at a point closer to star node 503 or power supply pin 502 than the signal input of second comparator 512. Accordingly, the input to second comparator 512 is connected to a point on power supply bus 504 that is physically and electrically closer to the first circuit 506 than the point on power supply bus 504 at which the input to first comparator 510 is connected. In various embodiments, the signal input of second comparator is connected to conductive power supply bus 504 via a circuit path the does not include the star node.

The embodiment of FIG. 5B may advantageously reduce the incidence of false brown out detection by monitoring conductive power supply bus 504 at different points, and by requiring that the voltage of the signal inputs of comparators 510 and 512 fall below their respective comparison thresholds before de-asserting power supply status signal Pox. In various embodiments, the comparison thresholds associated with comparators 510 and 512 in brown out detector 521 may be the same or different. During operation, when the local power supply of first circuit 506 experiences a large current transient, which may occur if first circuit 506 is driving a low impedance load at a high edge rate, portions of the local power supply may experience a momentary dip in supply voltage, which may be visible at points of conductive power supply bus that are local to power supply input node 505. However, the voltage at star node 503 or power supply pin 502 might not experience the dip in voltage to the same degree because of line inductance between star node 503 and power supply input node 505. Thus, a dip in voltage that is only seen locally to first circuit 506 and not seen locally to power supply pin 502 or star node 503 is less likely to trigger brown out detector 521. On the other hand, when the power supply voltage provided externally to power supply pin 502, all points on conductive power supply bus 504 will eventually see a drop in voltage, which will cause brown out detector 521 to detect a brown out condition.

Figure 5C:
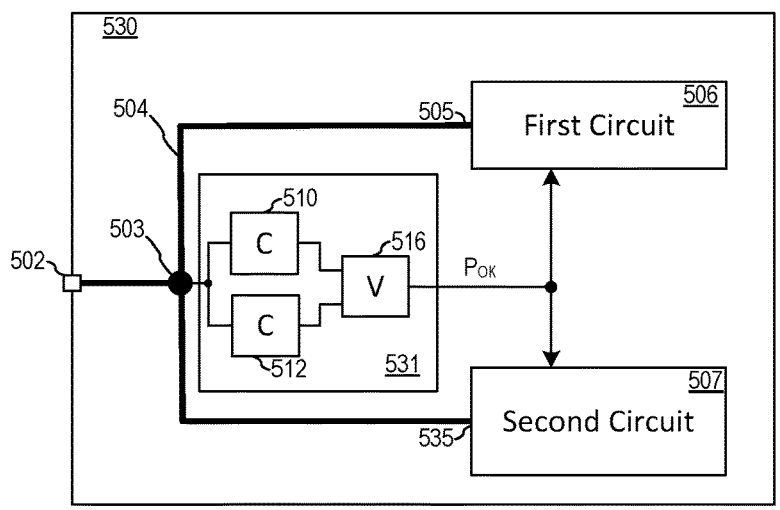

FIG. 5C illustrates an integrated circuit 530 that includes a first circuit 506 having a power supply input node 505 coupled to power supply pin 502 via conductive power supply bus 504, and a second circuit 507 having a power supply input node 535 coupled to power supply pin 502 via conductive power supply bus 504. Brown out detection circuit 531 includes a first comparator 510 and a second comparator 512 having their signal inputs connected to star node 503 of conductive power supply bus 504. In some embodiments, comparators 510 and 512 may have different comparison thresholds and/or may be configured to compare the voltage of star node 503 to different reference voltages as described above with respect to FIGS. 2, 3A and 4A. Power supply status signal $P_{OK}$ is coupled to both first circuit 506 and second circuit 507. In some embodiments, one or both of first circuit 506 and second circuit 507 are configured to be shut down when power supply status signal $P_{OK}$ is not asserted.

The embodiment of FIG. 5C may advantageously reduce the incidence of false brown out detection by monitoring conductive power supply bus 504 at star node 503. During operation, when the local power supply of first circuit 506 or second circuit 507 experiences a large current transient, portions of conductive power supply bus 504 local to power supply input node 505 of first circuit 506 and/or power supply input node 535 of second circuit 507 may experience a momentary dip in supply voltage. However, the voltage at star node 503 or power supply pin 502 might not experience the dip in voltage to the same degree because of line inductance between star node 503 and power supply input nodes 505 and 535. Thus, a dip in voltage that is only seen on conductive power supply bus 504 in the immediate vicinity of first circuit 506 or second circuit 507 and not in the vicinity of power supply pin 502 or star node 503 is less likely to trigger brown out detector 521 when the signal inputs of comparators 510 and 512 are connected to conductive power supply bus 504 in the vicinity of star node 503.

Figure 5D:
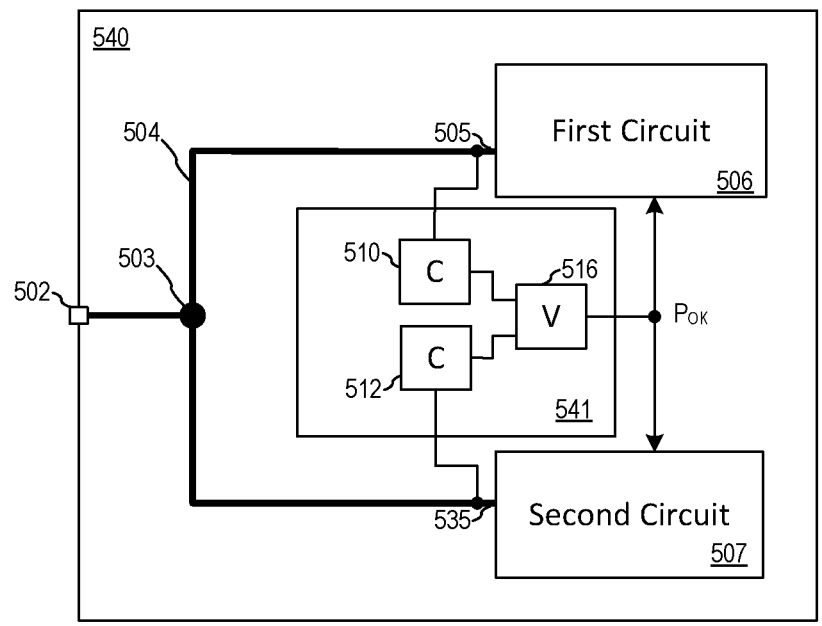

FIG. 5D illustrates an integrated circuit 540 that includes embodiment brown out detector 541 having a first comparator 510 with its signal input connected to conductive power supply bus 504 in the vicinity of power supply input node 505 of first circuit 506, and a second comparator 512 with its signal input connected to conductive power supply bus 504 in the vicinity of power input node 535 of second circuit 507. The comparison thresholds associated with comparators 510 and 512 may be the same or different.

The embodiment of FIG. 5D may advantageously reduce the incidence of false brown out detection by monitoring conductive power supply bus 504 at respective power supply input nodes 505 and 535 of first circuit 506 and second circuit 507, especially in systems in which first circuit 506 is not likely to experience a large current transient at the same time as second circuit 507. Thus, even if second circuit 507 experiences a current transient that causes a corresponding momentary dip in supply voltage at power supply node 535, the voltage at power supply input node 505 of first circuit 506 is not likely to experience a voltage dip of the same magnitude because of the line inductance of conductive power supply bus 504. Accordingly, brown out detector 541 is less likely to detect a brown out condition in such a scenario.

Figure 5E:
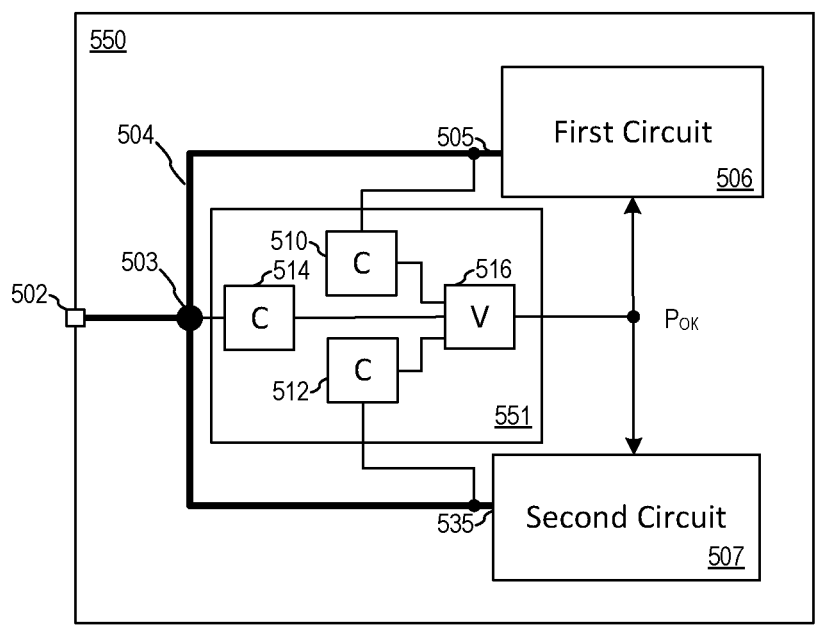

FIG. 5E illustrates integrated circuit 550 according to an embodiment of the present invention that includes brown out detector 551. Integrated circuit 550 is similar to integrated circuit 540 discussed above with respect to FIG. 5D, with the exception that brown out detector 551 includes an additional comparator 514 with a signal input coupled to star node 503 of conductive power supply bus 504. The comparison thresholds associated with comparators 510, 512 and 514 may be the same or different. In some implementations of the embodiment of FIG. 5E, the incidence of false brown out detection may be further reduced compared to the embodiment of FIG. 5D, since the voltages in the vicinity of all three points 503, 505 and 535 would need to drop below the respective reference voltages of corresponding comparators 514, 510 and 512 before brown out detector 551 detects a brown out condition and de-asserts power supply status signal $P_{OK}$.

While the embodiments of FIGS. 5D and 5E only show their respective brown out detectors locally connected to power supply nodes of two circuits (e.g. first circuit 506 and second circuit 507), it should be understood that in further embodiments of the present invention, additional circuits may be coupled to conductive power supply bus 504. In such embodiments, brown out detectors 541 and 551 may include additional comparators coupled to other points on conductive power supply bus 504 in the vicinity of these additional circuits.

Figure 5F:
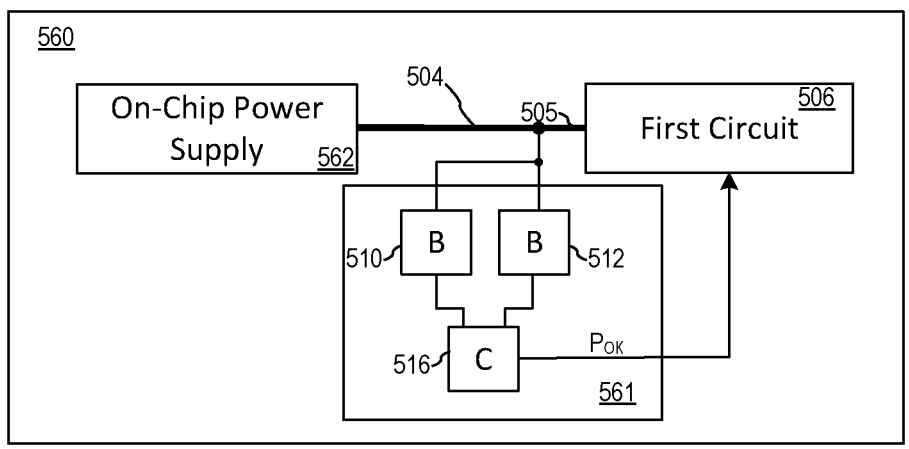

Embodiment brown out detection circuits may also be used to monitor power supply busses that receive their power from a on-chip power supply circuit instead of from an external pin. FIG. 5F illustrates an integrated circuit 560 that includes a first circuit 506 having a power supply input node 505 coupled to an on-chip power supply circuit 562. Comparators 510 and 512 of brown out detector 561 can be coupled to conductive power supply bus 504 at various points. For example, in various embodiments, the signal inputs of both comparators 510 and 512 may be coupled to conductive power supply bus 504 in the vicinity of power supply input node 505 of first circuit 506; the signal inputs to both comparators 510 and 512 may be coupled to conductive power supply bus 504 in the vicinity of the output of on-chip power supply circuit 562; or the signal input of one of comparators 510 and 512 may be connected to conductive power supply bus 504 in the vicinity of the output of on-chip power supply circuit 562, while the signal input to the other one of comparators 510 and 512 is connected to conductive power supply bus 504 in the vicinity of power supply input node 505. Alternatively, the signal inputs to comparators 510 and 512 may be connected to other points of conductive power supply bus 504.

On-chip power supply circuit 562 may be implemented using on-chip power supply circuits known in the art including, but not limited to series regulation circuits, switched-mode power supplies, and charge-pump circuits.

Figure 6:
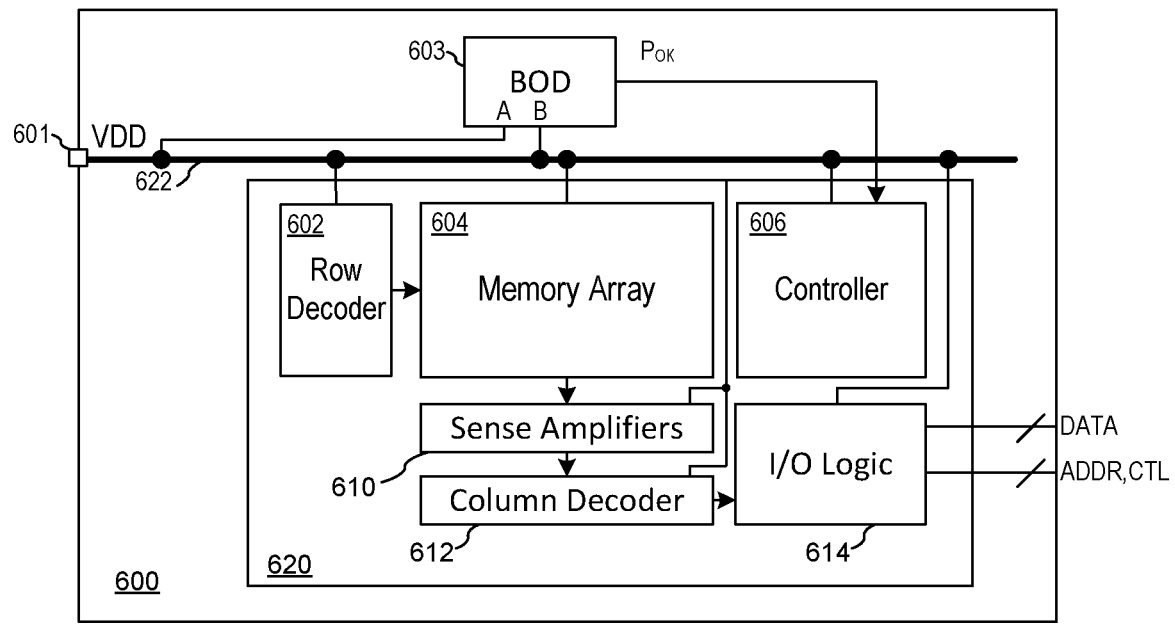
FIG. 6 illustrates a block diagram of an embodiment integrated circuit memory that uses an embodiment brown out detector.

FIG. 6 illustrates an integrated circuit 600 that includes a memory circuit 620 and a brown out detector 603 according to an embodiment of the present invention. As shown, memory 620 includes memory array 604, row decoder 602, memory controller 606, sense amplifiers 610, column decoder 612 and I/O logic 614 that are coupled to power supply pin 601 via conductive power supply line 622. Brown out detector 603, which may be implemented using any of the embodiment brown out detection circuits described herein, has inputs A and B coupled to conductive power supply line 622, and an output configured to provide power supply status signal $P_{OK}$. Inputs A and B may be respectively connected to a single point or to multiple points on conductive power supply line 622 and/or may have greater than two inputs as described above with respect to the embodiments of FIGS. 2, 3E, 4A-4B, and 5E.

While FIG. 6 shows all blocks in memory circuit 620 connected to the same conductive power supply line 622, it should be understood that in other embodiments, more than one power supply bus and/or power supply pin could be used to supply specific blocks within memory circuit 620. In further embodiments, one or more portions of memory circuit 620 could also be supplied by on-chip power supply circuits such as is discussed above with respect to FIG. 5F. Integrated circuit 600 may also include other circuit besides memory circuit 620, such as would be the case, for example, in a processor and/or an integrated circuit having on-chip embedded memory.

Memory array 604 includes an array of memory cells that may include non-volatile memory cells such as floating gate memory cells or SONOS memory cells. Sense amplifiers 610 are coupled to columns of memory array 604 and are configured to detect the state of memory cells within memory array 604. During operation, based on address data ADDR provided at the input to I/O logic 614, row decoder selects a row of memory cells within memory array 604 to be read by sense amplifiers 610, and column decoder 612 selects columns of memory array to be output via I/O logic 614 via data lines DATA. Memory controller 606 is a memory controller that controls the operation of the memory. Brown out detector 603 provides power supply status signal $P_{OK}$ to memory controller 606 based on detected voltages of conductive power supply line 622. In various embodiments, memory controller 606 is configured to shut down memory circuit 620 when power supply status signal $P_{OK}$ is not asserted.

Figure 7A:
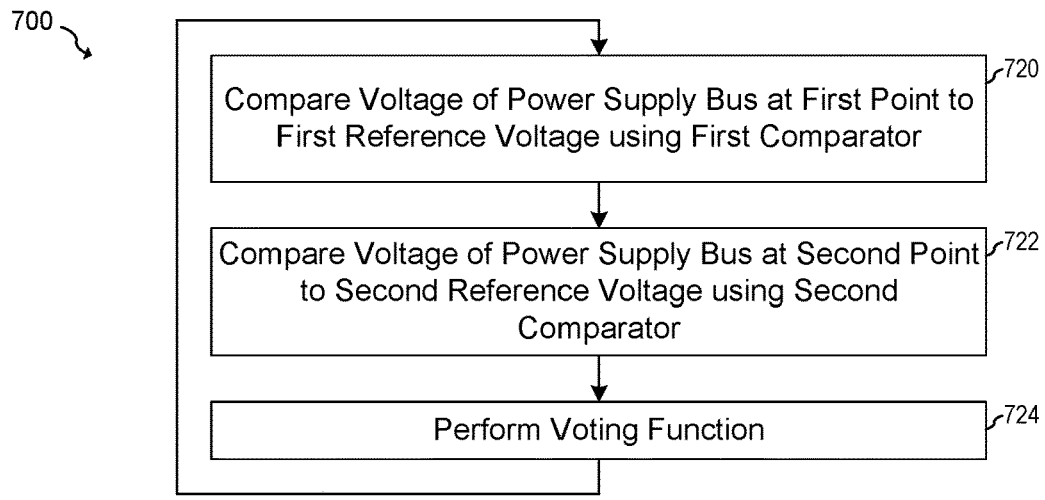
FIGS. 7A and 7B illustrate block diagrams of methods according to an embodiment.
Figure 7B:
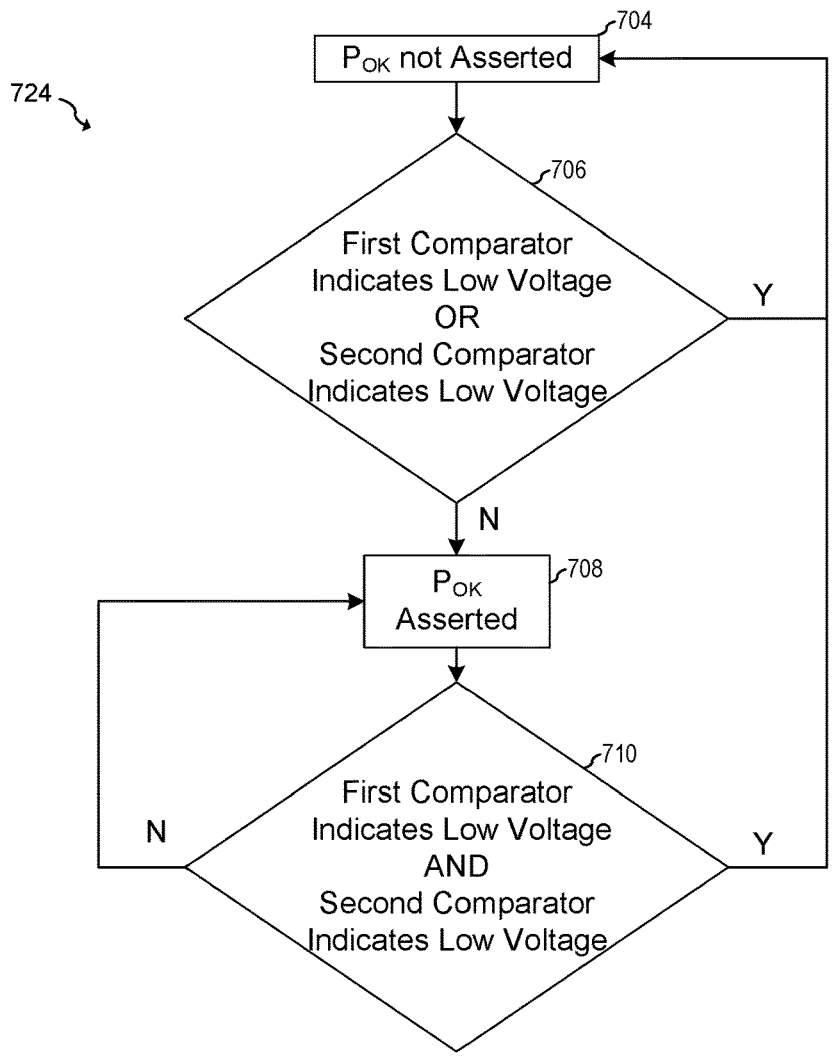

FIGS. 7A and 7B illustrate a block of a method of monitoring a power supply bus. As shown in FIG. 7A, method 700 includes comparing a voltage of a power supply bus at a first point to a first reference voltage using a first comparator (step 720), and comparing a voltage of the power supply bus at a second point to a second reference voltage using a second comparator (step 722). Comparators described with respect to the embodiments described herein may be used to implement the first and second comparators. In various embodiments, the first and second reference voltages and/or the comparators' respective comparison thresholds may be the same or different. The first and second points of the power supply bus may be the same or different and may be located on portions of the power supply bus as discussed herein, for example, with respect to the embodiments of FIGS. 5A-5F. In some embodiments, the method may also include comparing the voltage of the power supply to one or more additional reference voltages using one or more additional comparators. In step 724 a voting function is performed on the outputs of the first and second comparator. As described above with respect to FIGS. 2, 3A-3E and 4A-4B, the voting function may implement the functionality of a c-element or a majority gate. In various embodiments, steps 720, 722 and 724 may be performed concurrently.

FIG. 7B illustrates a block diagram of voting function step 724 for embodiments that use a c-element based voting function. Step 704 represents a brown out state in which power supply status signal $P_{OK}$ is not asserted, which indicates the brown out state to other components in the system. As long as the first comparator or the second comparator indicates a low voltage condition (step 706), the voting function stays in the brown out state and power supply status signal $P_{OK}$ remains unasserted. Step 706 transitions back to step 704 as long as the voltage at the first point of the power supply bus is less then the first reference voltage as measured by the first comparator or the voltage at the second point of the power supply bus is less than the second reference voltage as measured by the second comparator. When the condition of step 706 is not longer met (e.g. when the voltage at the first point of the power supply bus is not less than the first reference voltage as measured by the first comparator or the voltage at the second point of the power supply bus is not less than the second reference voltage as measured by the second comparator), the voting function transitions out of the brown out state and into an operational power state in step 708. In step 708, power supply status signal $P_{OK}$ is asserted, which indicates the operational power state to other components in the system.

As long as both the first comparator and the second comparator do not indicate a low voltage condition (step 710), the voting function stays in the operational power state and power supply status signal $P_{OK}$ remains asserted. Step 710 transitions back to step 708 as long as the voltage at the first point of the power supply bus is not less than the first reference voltage as measured by the first comparator or the voltage at the second point of the power supply bus is not less than the second reference voltage as measured by the second comparator. When the condition of step 710 is no longer met (e.g. when both the voltage at the first point of the power supply bus is less than the first reference voltage as measured by the first comparator and the voltage at the second point of the power supply bus is less than the second reference voltage as measured by the second comparator), the voting function transitions out of the operation power state and into the brown out state in step 704, and power supply status signal $P_{OK}$ is de-asserted, which indicates the brown out state to other components in the system.

Figure 8:
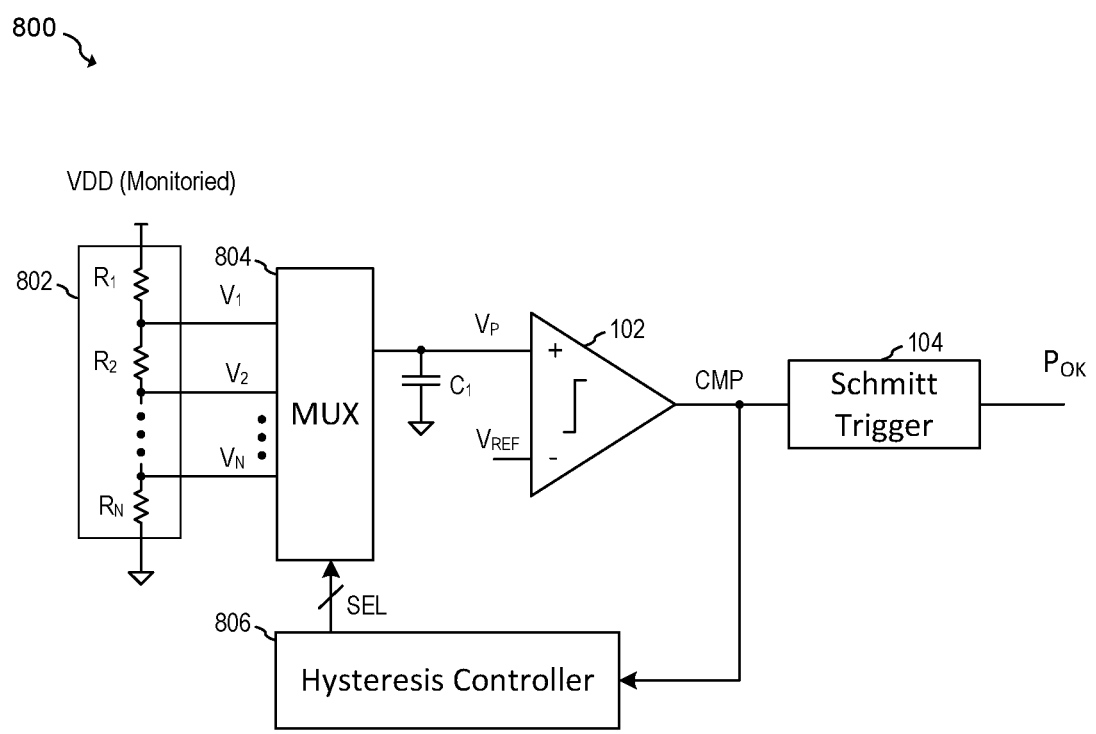
FIG. 8 illustrates a supply monitoring circuit according to an embodiment.

FIG. 8 illustrates a supply monitoring circuit 800 that can be used in place of comparators 204, 205, 206, 510, 512 and 516 that appear in one or more of FIGS. 2, 3A, 4A and 5A-5E. As shown, supply monitoring circuit 800 includes a resistive voltage divider 802, analog multiplexer 804, comparators 102, capacitor $C_1$, Schmitt trigger 104 and hysteresis controller 806. Comparator 102 has a positive input $V_P$ that is coupled to the output of multiplexer 804, and a negative input that is coupled to reference voltage $V_{REF}$ that can be a fixed voltage in some embodiments. Resistor divider 802 includes any number of series connected resistors $R_1$, $R_2$ to $R_N$ coupled to corresponding nodes $V_1$, $V_2$ to $V_N$, such that the voltage on nodes $V_1$, $V_2$ to $V_N$ correspond to various division ratios of monitored supply voltage VDD.

During operation, hysteresis controller 806 and analog multiplexer 804 select a first one of nodes $V_1$, $V_2$ to $V_N$ when the output CMP of comparator 102 is in a first state, and selects a second one of nodes $V_1$, $V_2$ to $V_N$ when the output CMP of comparator 102 is in a second state. In one specific operational example, when voltage at node $V_P$ is less than voltage $V_{REF}$, the output of comparator 102 is low and hysteresis controller 806 causes analog multiplexer 804 to couple node $V_2$ to node $V_P$, such that the voltage at node $V_2$ is applied to the positive input $V_P$ of comparator 102. However, when the voltage at node $V_P$ is greater than voltage $V_{REF}$, the output of comparator 102 is high and hysteresis controller 806 causes analog multiplexer 804 to couple node $V_1$ to node $V_P$, such that the voltage at node $V_1$ is applied to the positive input $V_P$ of comparator 102. In such an embodiment, the effective threshold of supply monitoring circuit 800 is higher when the output CMP of comparator 102 CMP is high, than when the output CMP of comparator 102 is low.

Analog multiplexer 804 may be implemented using analog multiplexer circuits known in the art, for example, a plurality of switching transistors that selectively couple corresponding ones of nodes $V_1$, $V_2$ to $V_N$ to node $V_P$. Analog multiplexer 804 may have any number of inputs equal or greater than two. Hysteresis controller 806 may be implemented, for example, using a logic circuit, such as one or more logic gates, that map the states of output CMP of comparator 102 to corresponding states of select signal SEL.

In some embodiments, capacitor $C_1$, in conjunction with resistors $R_1$ to $R_N$ of resistive voltage divider 802 may be used to low pass filter the monitored power supply node VDD, and Schmitt trigger 104 may be used to reduce the effect of metastability at the output of comparator 102. In some embodiments, one or both of capacitor $C_1$ or Schmitt trigger 104 may be omitted.

Figures 9A, 9B:
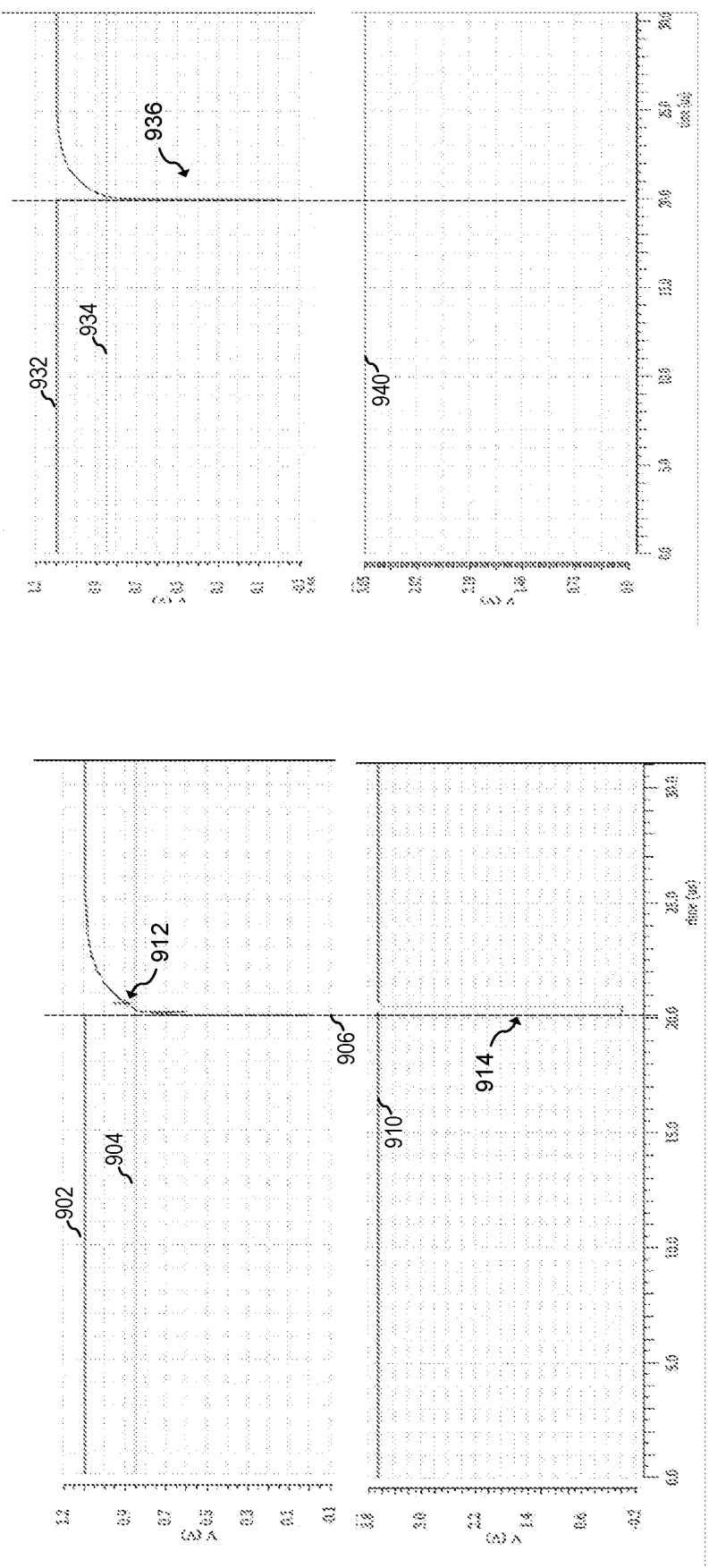
FIGS. 9A, 9B and 9C illustrate waveform diagrams related to the performance of embodiment power supply monitoring systems.
Figure 9C:
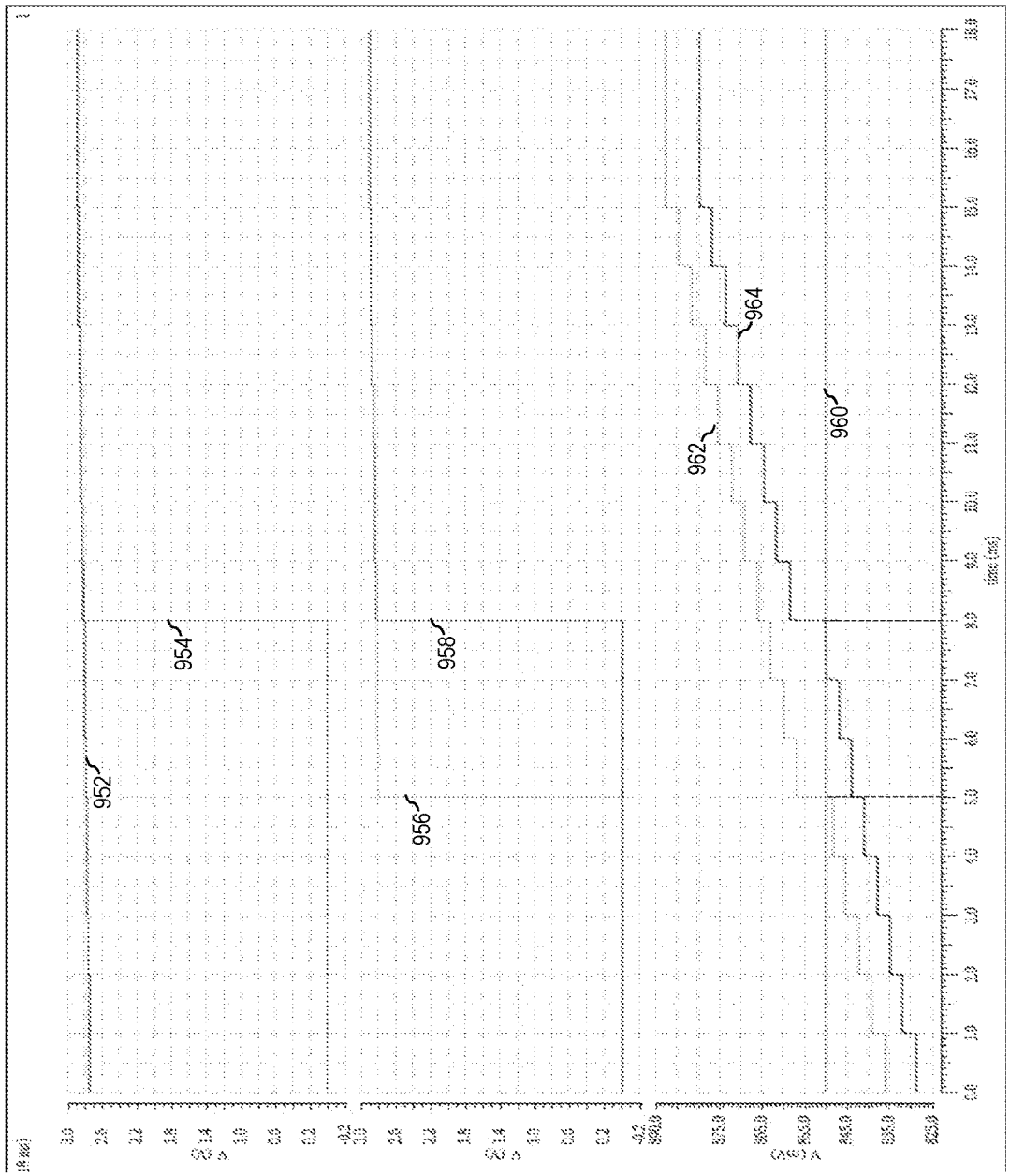

FIGS. 9A-9C illustrate waveform diagrams related to the performance of embodiment power supply monitoring systems. FIG. 9A illustrates a waveform diagram showing the simulated performance of a brown out detector circuit, such as the exemplary brown out detector 100 shown in FIG. 1. Trace 902 represents a divided power supply voltage VDD, trace 904 represents reference voltage $V_{REF}$, and trace 910 represents power supply status signal $P_{OK}$. As shown, at time 906, the power supply voltage undergoes a short voltage transient that causes a corresponding short voltage transient in the divided supply voltage 902. This causes a corresponding toggling 914 of power supply status signal $P_{OK}$ (trace 910). Glitching 912, caused, for example, by excessive current draw, can also be seen in the divided power supply voltage (trace 902).

FIG. 9B illustrates a waveform diagram showing the simulated performance of a brown out detector circuit, such as the embodiment brown out detector system 200 shown in FIG. 2. Trace 932 represents a divided power supply voltage VDD, trace 934 represents reference voltage $V_{REF1}$, and trace 940 represents power supply status signal $P_{OK}$. As shown, at time 936, the power supply voltage undergoes a short voltage transient that causes a corresponding short voltage transient in the divided supply voltage (trace 902). However, unlike the simulation of exemplary brown out detector 100 shown in FIG. 9A, power supply status signal $P_{OK}$ (trace 940) does not toggle and no glitching is seen on the divided supply voltage (trace 902).

FIG. 9C illustrates a waveform diagram showing the simulated performance of a brown out detector circuit, such as the embodiment brown out detector 300 shown in FIG. 3A using in which comparators 204 and 206 are each replaced by a corresponding instance of supply monitoring circuit 800 illustrated in FIG. 8. Trace 952 represents the monitored supply voltage, trace 954 represents power supply status signal $P_{OK}$, trace 956 represents the output of a first instance of supply monitoring circuit 800, trace 958 represents the output of a second instance of supply monitoring circuit 800, trace 960 represents a reference voltage, trace 962 represents a divided input voltage provided to the comparator 102 of the first instance of supply monitoring circuit 800, and trace 964 represents a divided input voltage provided to the comparator 102 of the second instance of supply monitoring circuit 800.

As shown, the monitored supply voltage (trace 852) is simulated as a 10 mV per step ramp from 2.75 V to 2.9 V. The first instance of supply monitoring circuit 800 has an effective comparison threshold of 2.8 V and the second instance of supply monitoring circuit 800 has an effective comparison threshold of 2.825 V.

At t=5 μs, the divided input voltage of the first comparator (trace 862) exceeds the reference voltage 860, which causes the output of the first comparator to go high (trace 856). Subsequently at t=8 μs, the divided input voltage of the second comparator (trace 864) exceeds the reference voltage 860, which causes the output of the second comparator to go high (trace 858), and causes power supply status signal Pox (trace 854) to be asserted. The increase in step size of the divided input voltage of the first comparator (trace 862) at t=5 μs, and the increase in step size of the divided input voltage of the second comparator (trace 864) are the result of hysteresis being applied to the first and second instances of supply monitoring circuit 800.

Embodiments of the present invention are summarized here. Other embodiments can also be understood from the entirety of the specification and the claims filed herein.

Example 1. A circuit including: a plurality of comparators disposed on an integrated circuit, the plurality of comparators having inputs coupled to a monitored power supply line; and a voting circuit having inputs coupled to outputs of the plurality of comparators, where an output of the voting circuit is configured to provide a signal indicative of a brown out condition of a power source coupled to the monitored power supply line.

Example 2. The circuit of example 1, where: a first comparator of the plurality of comparators has a first comparison threshold; and a second comparator of the plurality of comparators has a second comparison threshold.

Example 3. The circuit of one of examples 1 or 2, where the first comparison threshold is different from the second comparison threshold.

Example 4. The circuit of one of examples 1 to 3, where the inputs of the plurality of comparators are connected to a star point of the monitored power supply line.

Example 5. The circuit of example 3, further including a first circuit connected to the monitored power supply line via a first conductor that extends from a star point of the monitored power supply line, where an input of a first comparator of the plurality of comparators is connected to the star point of the monitored power supply line; and an input of a second comparator of the plurality of comparators is connected to the first conductor via a circuit path that does not include the star point.

Example 6. The circuit of example 5, further including a second circuit connected to the monitored power supply line via a second conductor that extends from the star point of the monitored power supply line, where: an input of the second comparator of the plurality of comparators is connected to the second conductor via a circuit path that does not include the star point and does not include the first conductor.

Example 7. The circuit of one of examples 1 to 6, where the voting circuit includes a c-element.

Example 8. The circuit of one of examples 1 to 7, where the voting circuit includes: a first c-element having inputs coupled to a first group of comparators of the plurality of comparators; a second c-element having inputs coupled to a second group of comparators of the plurality of comparators; and a third c-element having a first input coupled to an output of the first c-element, and a second input coupled to an output of the second c-element.

Example 9. The circuit of one of examples 1 to 8, where the voting circuit includes a majority gate.

Example 10. The circuit of one of examples 1 to 9, where the at least one of the plurality of comparators includes a hysteresis circuit.

Example 11. A method of operating an integrated circuit, the method including: comparing a first voltage at a first point of a power supply bus to a first reference voltage; comparing a second voltage at a second point of a power supply to a second reference voltage; transitioning to a brown out state when the first voltage is less than the first reference voltage and the second voltage is less than the second reference voltage; after transitioning to the brown out state, remaining in the brown out state when the first voltage remains less than the first reference voltage or the second voltage is remains less than the second reference voltage; transitioning out of the brown out state when the first voltage exceeds the first reference voltage and the second voltage exceeds the second reference voltage; after transitioning out of the brown out state, remaining out of the brown out state when the first voltage remains higher than the first reference voltage or the second voltage remains higher than the second reference voltage; and indicating a brown out condition upon transitioning to the brown out state.

Example 12. The method of example 11, further including shutting off a first circuit connected to the power supply when the brown out condition is indicated.

Example 13. The method of one of examples 11 or 12, where the first point of the power supply bus and the second point of the power supply bus are a same point.

Example 14. The method of one of examples 11 or 12, where: the power supply bus is coupled to a first circuit; and the second point of the power supply bus is electrically closer to the first circuit than the first point of the power supply bus.

Example 15. The method of one of examples 11 to 14, where: the first and second voltages are fluctuating; and the first and second reference voltages are programmably fixed.

Example 16. An integrated circuit including: a memory circuit; a conductive power supply bus coupled between a power source node and a power supply input of the memory circuit; a brown out detector coupled to the conductive power supply bus, the brown out detector including: a first comparator having a signal input coupled to the conductive power supply bus; a second comparator having a signal input coupled to the conductive power supply bus; and a voting circuit having inputs coupled to outputs of the first comparator and the second comparator, and an output coupled to a shutdown input of the memory circuit.

Example 17. The integrated circuit of example 16, where the voting circuit includes a c-element.

Example 18. The integrated circuit of one of examples 16 or 17, further including a bond pad connected to the power source node.

Example 19. The integrated circuit of one of examples 16 to 18, further including a reference voltage generator having a first output coupled to a reference voltage input of the first comparator, and a second output coupled to a reference voltage input of the second comparator, where the reference voltage generator is configured to provide a first reference voltage at the first output and a second reference voltage different from the first reference voltage at the second output.

Example 20. The integrated circuit of one of examples 16 to 19, where: the signal input of the first comparator is physically connected to a first point on the conductive power supply bus; and the signal input of the second comparator is physically connected to a second point on the conductive power supply bus.

Example 21. The integrated circuit of one of examples 16 to 20, where the first point on the conductive power supply bus is electrically closer to the power supply input of the memory circuit than the second point of the conductive power supply bus.

Example 22. The integrated circuit of one of examples 16 to 21, where the memory circuit includes silicon-oxide-nitride-oxide-silicon (SONOS) based non-volatile memory arrays.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a plurality of comparators disposed on an integrated circuit, the plurality of comparators having inputs coupled to a monitored power supply line; and
    a voting circuit having inputs coupled to outputs of the plurality of comparators, wherein an output of the voting circuit is configured to provide a signal indicative of a brown out condition of a power source coupled to the monitored power supply line, and the voting circuit comprises:
        at least one c-element, wherein a single c-element of the at least one c-element has inputs coupled to the outputs of at least two comparators of the plurality of comparators, or
        a majority gate having inputs coupled to the outputs of at least three comparators of the plurality of comparators.

2. The circuit of claim 1, wherein:
    a first comparator of the plurality of comparators has a first comparison threshold; and
    a second comparator of the plurality of comparators has a second comparison threshold.

3. The circuit of claim 2, wherein the first comparison threshold is different from the second comparison threshold.

4. The circuit of claim 1, wherein the inputs of the plurality of comparators are connected to a star point of the monitored power supply line.

5. The circuit of claim 1, further comprising a first circuit connected to the monitored power supply line via a first conductor that extends from a star point of the monitored power supply line, wherein
    an input of a first comparator of the plurality of comparators is connected to the star point of the monitored power supply line.

6. The circuit of claim 5, further comprising a second circuit connected to the monitored power supply line via a second conductor that extends from the star point of the monitored power supply line, wherein:
    an input of a second comparator of the plurality of comparators is connected to the second conductor via a circuit path that does not include the star point and does not include the first conductor.

7. The circuit of claim 5, wherein an input of a second comparator of the plurality of comparators is connected to the first conductor via a circuit path that does not include the star point.

8. The circuit of claim 1, wherein the voting circuit comprises:
    a first c-element having inputs coupled to a first group of comparators of the plurality of comparators;
    a second c-element having inputs coupled to a second group of comparators of the plurality of comparators; and
    a third c-element having a first input coupled to an output of the first c-element, and a second input coupled to an output of the second c-element.

9. The circuit of claim 1, wherein the at least one of the plurality of comparators comprises a hysteresis circuit.

10. An integrated circuit comprising:
    a memory circuit;
    a conductive power supply bus coupled between a power source node and a power supply input of the memory circuit;
    a brown out detector coupled to the conductive power supply bus, the brown out detector comprising:
        a plurality of comparators disposed on an integrated circuit, the plurality of comparators having inputs coupled to the conductive power supply bus; and
        a voting circuit having inputs coupled to outputs of the plurality of comparators, wherein an output of the voting circuit is configured to provide a signal indicative of a brown out condition of a power source coupled to the conductive power supply bus, the output of the voting circuit is coupled to a shutdown input of the memory circuit, and the voting circuit comprises:
            at least one c-element, wherein a single c-element of the at least one c-element has inputs coupled to the outputs of at least two comparators of the plurality of comparators, or
            a majority gate having inputs coupled to the outputs of at least three comparators of the plurality of comparators.

11. The integrated circuit of claim 10, further comprising a bond pad connected to the power source node.

12. The integrated circuit of claim 10, wherein:
    the plurality of comparators comprises a first comparator having a signal input coupled to the conductive power supply bus, and a second comparator having a signal input coupled to the conductive power supply bus; and
    the integrated circuit further comprises a reference voltage generator having a first output coupled to a reference voltage input of the first comparator, and a second output coupled to a reference voltage input of the second comparator, wherein the reference voltage generator is configured to provide a first reference voltage at the first output and a second reference voltage different from the first reference voltage at the second output.

13. The integrated circuit of claim 10, wherein:
    the plurality of comparators comprises a first comparator having a signal input coupled to the conductive power supply bus, and a second comparator having a signal input coupled to the conductive power supply bus;
    the signal input of the first comparator is physically connected to a first point on the conductive power supply bus; and
    the signal input of the second comparator is physically connected to a second point on the conductive power supply bus.

14. The integrated circuit of claim 13, wherein the first point on the conductive power supply bus is electrically closer to the power supply input of the memory circuit than the second point of the conductive power supply bus.

15. The integrated circuit of claim 10, wherein the memory circuit includes silicon-oxide-nitride-oxide-silicon (SONOS) based non-volatile memory arrays.

16. The integrated circuit of claim 10, wherein:
    the conductive power supply bus comprises a first conductor that extends from a star point of the conductive power supply bus to the power supply input of the memory circuit; and
    an input of a first comparator of the plurality of comparators is connected to the star point of the conductive power supply bus.

17. The integrated circuit of claim 16, wherein an input of a second comparator of the plurality of comparators is connected to the first conductor via a circuit path that does not include the star point.

18. The integrated circuit of claim 16, further comprising a second circuit connected to the conductive power supply bus via a second conductor that extends from the star point of the conductive power supply bus, wherein an input of a second comparator of the plurality of comparators is connected to the second conductor via a circuit path that does not include the star point and does not include the first conductor.

19. The integrated circuit of claim 10, wherein the at least one of the plurality of comparators comprises a hysteresis circuit.

20. A method of operating a circuit comprising a plurality of comparators disposed on an integrated circuit, the plurality of comparators having inputs coupled to a monitored power supply line; and a voting circuit having inputs coupled to outputs of the plurality of comparators, wherein an output of the voting circuit is configured to provide a signal indicative of a brown out condition of a power source coupled to the monitored power supply line, the method comprising:
  using the plurality of comparators, comparing voltages of the monitored power supply line with a plurality of corresponding thresholds, wherein a first comparator of the plurality of comparators has a first comparison threshold, a second comparator of the plurality of comparators has a second comparison threshold, and comparing the voltages of the monitored power supply line with the plurality of corresponding thresholds comprises:
    comparing a first voltage at a first point of the monitored power supply line with the first comparison threshold using the first comparator, and
    comparing a second voltage at a second point of the monitored power supply line with the second comparison threshold using the second comparator;
  using the voting circuit, providing the signal indicative of a brown out condition of the power source based on outputs of the plurality of comparators by:
    transitioning to a brown out state in response to the first voltage being less than the first comparison threshold and the second voltage being less than the second comparison threshold;
    after transitioning to the brown out state, remaining in the brown out state in response to the first voltage remaining less than the first comparison threshold or the second voltage remaining less than the second comparison threshold;
    transitioning out of the brown out state in response to the first voltage exceeding the first comparison threshold and the second voltage exceeding the second comparison threshold;
    after transitioning out of the brown out state, remaining out of the brown out state in response to the first voltage remaining higher than the first comparison threshold or the second voltage remaining higher than the second comparison threshold; and
    asserting the signal indicative of the brown out condition upon transitioning to the brown out state.

21. The method of claim 20, wherein the first comparison threshold is different from the second comparison threshold.

22. The method of claim 20, wherein the inputs of the plurality of comparators are connected to a star point of the monitored power supply line.

* * * * *